(12) United States Patent
Song et al.

(10) Patent No.: US 11,886,064 B2
(45) Date of Patent: Jan. 30, 2024

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Dewei Song, Hubei (CN); Fei Ai, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 859 days.

(21) Appl. No.: 16/963,787

(22) PCT Filed: Jun. 23, 2020

(86) PCT No.: PCT/CN2020/097683
§ 371 (c)(1),
(2) Date: Jul. 21, 2020

(87) PCT Pub. No.: WO2021/248558
PCT Pub. Date: Dec. 16, 2021

(65) Prior Publication Data
US 2023/0176410 A1  Jun. 8, 2023

(30) Foreign Application Priority Data
Jun. 9, 2020 (CN) .......................... 202010520108.9

(51) Int. Cl.
*G02F 1/133* (2006.01)
*G02F 1/1333* (2006.01)
(Continued)

(52) U.S. Cl.
CPC ...... *G02F 1/133354* (2021.01); *G02F 1/1368* (2013.01); *H01L 27/1248* (2013.01)

(58) Field of Classification Search
CPC ... G02F 1/133; G02F 1/1333; G02F 1/133388
See application file for complete search history.

(56) References Cited

U.S. PATENT DOCUMENTS 7,728,947 B1  6/2010  Kim et al.
11,189,677 B2 *  11/2021  Park ................... H01L 27/1259
(Continued)

FOREIGN PATENT DOCUMENTS

CN  103278978 A  9/2013
CN  204116768 U  1/2015
(Continued)

*Primary Examiner* — Jae Lee
(74) *Attorney, Agent, or Firm* — PV IP PC; Wei Te Chung; Zhigang Ma

(57) ABSTRACT

The present application provides a display panel and a display device. The display panel includes an array substrate, a color filter substrate, and a colloid layer. The array substrate includes a thin film transistor layer and a passivation layer. The passivation layer includes at least one first connection element. The color filter substrate is disposed opposite to the array substrate. The colloid layer is arranged between the passivation layer and the color filter substrate, the colloid layer is connected to the first connection element, and the colloid layer and the first connection element couple the array substrate to the color filter substrate.

16 Claims, 4 Drawing Sheets

(51) Int. Cl.
    *G02F 1/1368*     (2006.01)
    *H01L 27/12*     (2006.01)

(56) References Cited

U.S. PATENT DOCUMENTS

| | | |
|---|---|---|
| 2002/0030769 A1 | 3/2002 | Bae |
| 2008/0123029 A1* | 5/2008 | Ko .................... G02F 1/133512 349/96 |

FOREIGN PATENT DOCUMENTS

| | | |
|---|---|---|
| CN | 104915054 A | 9/2015 |
| CN | 106206615 A | 12/2016 |
| CN | 107272270 A | 10/2017 |
| CN | 107463042 A | 12/2017 |
| CN | 107678203 A | 2/2018 |
| CN | 109116606 A | 1/2019 |
| CN | 208689331 U | 4/2019 |

\* cited by examiner

DISPLAY PANEL AND DISPLAY DEVICE

FIELD OF DISCLOSURE

The present application relates to a field of display technology, in particular to a field of manufacturing technology of a display panel and a display device, and to be specific, a display panel and a display device.

DESCRIPTION OF RELATED ART

LCDs (liquid crystal displays) have advantages of high image quality, power saving, low radiation and a wide range of applications. In order to reduce a production time of LCD, there is a technology that omits a planarization layer in the LCD.

However, after the planarization layer is omitted, external water/moisture easily enters into film layers of the LCD, and a connection force between an array substrate and a color filter substrate also decreases, resulting in poor waterproofing and a weak structure of the LCD product.

In summary, it is necessary to provide a display panel and a display device that can improve waterproofing and robustness.

SUMMARY

The present application provides a display panel and a display device. By providing a first connection element in a passivation layer, a colloid layer and the first connection element couple an array substrate to a color filter substrate to improve waterproofing and robustness of LCD products.

The present application provides a display panel, wherein the display panel is constituted by a display region and a non-display region arranged around the display region, the display panel comprising:
  an array substrate, the array substrate comprising:
    a thin film transistor (TFT) layer; and
    a passivation layer disposed on the TFT layer, wherein the passivation layer comprises at least one first connection element, the first connection element is disposed in the non-display region;
  a color filter substrate disposed opposite to the array substrate; and
  a colloid layer, wherein the colloid layer is disposed between the passivation layer and the color filter substrate, the colloid layer is connected to the first connection element, and the colloid layer and the first connection element couple the array substrate to the color filter substrate.

According to one embodiment, a projection of each of the at least one first connection element projected on a horizontal plane is circular, polygonal, or of a hollow shape.

According to one embodiment, the projection of each of the at least one first connection element projected on the horizontal plane is circular or polygonal, the passivation layer comprises multiple first connection elements, and the first connection elements are disposed at a same side or different sides of the display region.

According to one embodiment, the projection of each of the at least one first connection element projected on the horizontal plane has a hollow shape, the hollow shape has a hollow area, and a projection of the display region projected on the horizontal plane is located inside the hollow area.

According to one embodiment, the passivation layer comprises two first connection elements, and one of the first connection elements is disposed inside the hollow area of the other first connection element.

The present application further provides a display panel, comprising:
  an array substrate, the array substrate comprising:
    a thin film transistor (TFT) layer; and
    a passivation layer disposed on the TFT layer, the passivation layer comprising at least one first connection element;
  a color filter substrate, wherein the color filter substrate and the array substrate are arranged opposite to each other; and
  a colloid layer, wherein the colloid layer is disposed between the passivation layer and the color filter substrate, the colloid layer is connected to the first connection element, and the colloid layer and the first connection element couple the array substrate to the color filter substrate.

According to one embodiment, the display panel is constituted by a display region and a non-display region arranged around the display region, and the at least one first connection element is disposed in the non-display region.

According to one embodiment, a projection of each of the at least one first connection element projected on a horizontal plane is circular, polygonal, or of a hollow shape.

According to one embodiment, the projection of each of the at least one first connection element projected on the horizontal plane is circular or polygonal, the passivation layer comprises multiple first connection elements, and the first connection elements are disposed at a same side or different sides of the display region.

According to one embodiment, the first connection element is a solid of revolution or a polyhedron.

According to one embodiment, the first connection elements are disposed around the display region.

According to one embodiment, the projection of each of the at least one first connection element projected on the horizontal plane has the hollow shape, the hollow shape has a hollow area, and a projection of the display region projected on the horizontal plane is located inside the hollow area.

According to one embodiment, at least one of an edge of the hollow shape on one side adjacent to the display region and an edge of the hollow shape on one side away from the display region includes at least one of a straight line segment and a curved line segment.

According to one embodiment, an edge of the hollow shape on one side away from the display region matches in shape with an edge of the hollow area.

According to one embodiment, the passivation layer comprises two first connection elements, and one of the first connection elements is disposed inside the hollow area of the other first connection element.

According to one embodiment, the passivation layer comprises:
  a first passivation layer, the first passivation layer disposed on the TFT layer; and
  a second passivation layer disposed on the first passivation layer, wherein a thickness of the second passivation layer is greater than or equal to $(0.95*10^{-7})$ mm, and less than or equal to $(1.05*10^{-7})$ mm;
  wherein the first connection element is disposed in the first passivation layer and the second passivation layer.

According to one embodiment, a thickness of the first passivation layer is 5 times a thickness of the second passivation layer.

According to one embodiment, the TFT layer comprises an interlayer insulation layer, the interlayer insulation layer comprises at least one second connection element, and the at least one second connection element is disposed corresponding to the first connection element; and the first connection element is connected to the second connection element, and the colloid layer couple the array substrate to the color filter substrate through the at least one first connection element and the at least one second connection element.

According to one embodiment, the at least one second connection element is a solid of revolution or a polyhedron.

The present application further provides a display device, and the display device comprises the display panel as described above.

Advantages of the Present Application

The present application provides a display panel and a display device. The display panel comprises an array substrate, a color filter substrate, and a colloid layer. The array substrate comprises a thin film transistor layer and a passivation layer. The passivation layer comprises at least one first connection element. The color filter substrate is disposed opposite to the array substrate. The colloid layer is disposed between the passivation layer and the color filter substrate, the colloid layer is connected to the first connection element, and the colloid layer and the first connection element couple the array substrate to the color filter substrate. By having the first connection element in the passivation layer and using the colloid layer and the first connection element to couple the array substrate to the color filter substrate, reliable connection between the array substrate and the color filter substrate is ensured, and waterproofing and robustness of the display panel are improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
FIG. 1 is a schematic partial cross-sectional view of a display panel according to one embodiment of the present application.

Technical solutions of the present application will be clearly and completely described below with reference to the accompanying drawings and in conjunction with specific embodiments. Obviously, the described embodiments are only some of the embodiments of the present application, but not all the embodiments. Based on the embodiments of the present application, all other embodiments obtained by those skilled in the art without creative work fall into the protection scope of the present application.

In the description of the present application, it should be understood that the directional terms, such as "upper", "lower", "opposite", "between", "adjacent to", "on the same side", "on different sides", "near", "parallel", "perpendicular", "left", "right", "surrounding", "horizontal", and "longitudinal", are based on the orientation or positional relationship shown in the drawings, and are only for the convenience of describing the present application and simplifying the description. The directional terms do not indicate or imply that the device or element referred to must have a specific orientation or be constructed or operated in a specific orientation. Therefore, the directional terms cannot be understood as a limitation to the present application. In addition, the terms "first" and "second" are used for illustrative purposes only, and cannot be understood as indicating or implying relative importance or implicitly indicating the number of technical features indicated. Therefore, the features defined as "first" and "second" may explicitly or implicitly include one or more of the features. In the description of the present application, "multiple" means two or more, unless specifically defined otherwise.

In the present application, unless explicitly stated and defined otherwise, a first element being "on" or "under" a second element may indicate that, the first element is in direct contact with the second element, or can mean that, the first element is not in direct contact with the second element, and instead they make contact through another element between them. Moreover, the first element being "above", ""over"", and "on" the second element can indicate that the first element is right above and obliquely above the second element, or merely indicates that the first element is higher in level than the second element. The first element being "below", "under", or "beneath" the second element can mean that, the first element is right below or obliquely below the second element, or merely indicates that the first element is lower in level than the second element.

In the description of the present application, it should be noted that the term "connected" should be understood in a broad sense unless otherwise specified and defined. For example, it can be a fixed connection, a detachable connection, or an integral connection; it can be a mechanical connection, an electrical connection, or two elements can communicate with each other. Two elements can be directly connected to each other or can be indirectly connected through an intermediate medium, or they are connected internally or interact with each other. For those of ordinary skill in the art, the specific meanings of the above term in the present application can be understood on a case-by-case basis.

In the drawings, structurally similar components are denoted by the same reference numerals. Reference to "embodiment" means that specific features, structures, or characteristics described in connection with the embodiment can be included in at least one embodiment of the present application. The appearance of an expression in various places in the specification does not necessarily refer to the same embodiment, nor does it necessarily refer to an independent or alternative embodiment mutually exclusive with other embodiments. Those skilled in the art understand explicitly and implicitly that the embodiments described herein can be combined with other embodiments.

The present application provides a display panel. The display panel comprises, but is not limited to, the following embodiments.

As shown in FIG. 1, according to one embodiment, the display panel 00 comprises an array substrate 10, a color filter substrate 20, and a colloid layer 30. The color filter substrate 20 is disposed opposite to the array substrate 10. The colloid layer 30 is disposed between the array substrate 10 and the color filter substrate 20.

Specifically, the array substrate 10 comprises a thin film transistor (TFT) layer 101 and a passivation layer 102, the passivation layer 102 is disposed on the TFT layer 101, and the passivation layer 102 comprises at least one first connection element 1021. The colloid layer 30 is disposed between the passivation layer 102 and the color filter substrate 20, the colloid layer 30 is connected to the first connection element 1021, and the colloid layer 30 and the first connection element 1021 couple the array substrate 10 to the color filter substrate 20.

According to one embodiment, the first connection element 1021 and the colloid layer 30 are made of a same material such as a material with adhesive properties on its upper and lower surfaces. Further, the first connection element 1021 and the colloid layer 30 can be integrally formed, which can be understood as: the passivation layer 102 comprises at least one through hole, and the colloid layer 30 is filled into the through hole to form the corresponding first connection element 1021.

Figure 2:
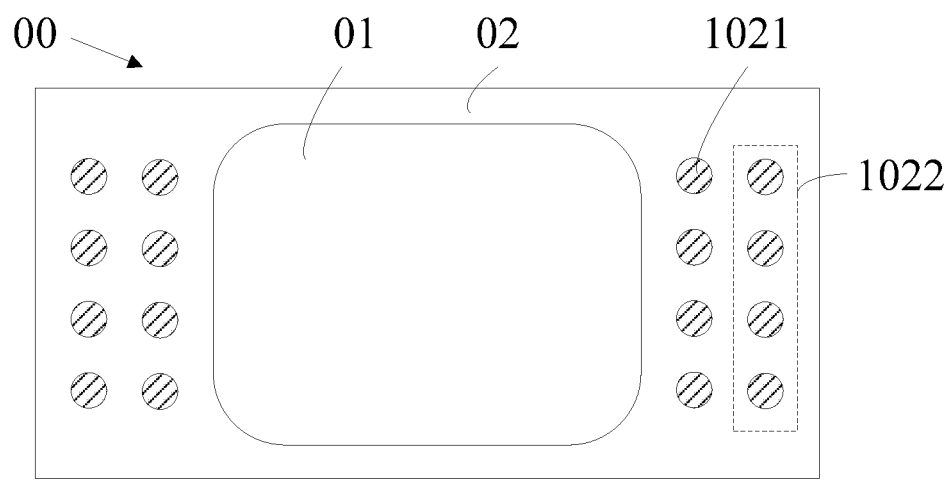
FIG. 2 is a schematic top view of the display panel according to a first embodiment of the present application.

In one embodiment, as shown in FIG. 2, the display panel 00 is constituted by a display region 01 and a non-display region 02 arranged around the display region 01, and the first connection element 1021 is disposed in the non-display region 02.

An edge of the display region 01 can include at least one of a straight line segment and a curved line segment. Specifically, the display region 01 can be rectangular, or circular, or of other shapes.

According to one embodiment, a projection of each of the at least one first connection element 1021 projected on a horizontal plane is circular, polygonal, or of a hollow shape. It should be noted that the circular shape and the polygonal shape are filled inside, rather than just showing their surrounding outlines, and the hollow shape can include one or multiple hollow areas inside.

It should be noted that when the passivation layer 102 comprises multiple first connection elements 1021, the projections of the first connection elements 1021 projected on the horizontal plane can have the same or different shapes. The projections of the first connection elements 1021 on the horizontal plane can have the same or different sizes. The drawing of the present embodiment is illustrated by taking for example that the projections of the first connection elements 1021 on the horizontal plane have the same shape and the same size; however, the present application is not limited in this regard.

In one embodiment, a side surface of the first connection element 1021 can comprise at least one of a flat surface and a curved surface. Further, the side surface of the first connection element 1021 is a curved surface. Specifically, the curved surface can be a concave curved surface or a convex curved surface. This can increase a contact area between the first connection element 1021 and a film layer in the passivation layer 102 to improve connection reliability between the array substrate 10 and the color filter substrate 20 in a direction therebetween.

According to one embodiment, the first connection element 1021 is a solid of revolution or a polyhedron. For example, when the projection of the first connection element 1021 on the horizontal plane is circular, the first connection element 1021 is a cylinder or a truncated cone; and when the projection of the first connection element 1021 on the horizontal plane is polygonal, the first connection element 1021 is a rectangular parallelepiped or a prism.

In one embodiment, as shown in FIG. 2, the projection of the first connection element 1021 projected on the horizontal plane is circular or polygonal, and the passivation layer 102 comprises multiple first connection elements 1021, and the first connection elements 1021 are disposed at the same side or different sides of the display region 01.

In one embodiment, the first connection elements 1021 can be disposed at different sides of the display region 01. As shown in FIG. 2, for illustration, the present embodiment takes for example that: the display region 01 has a rectangular-like shape with rounded corners, the projection of the first connection element 1021 on the horizontal plane is circular, and the first connection elements 1021 are disposed at the left and right sides of the display region 01; however, the present application is not limited in this regard. Specifically, the first connection elements 1021 located at the left and right sides of the display region 01 can be arranged along a first direction to form a first connection set 1022, and the first direction is parallel to a side of the display region 01 adjacent to the corresponding first connection elements 1021. Further, the first connection elements 1021 located at the left and right sides of the display region 01 can also form multiple first connection sets 1022, wherein the first connection sets 1022 can be arranged along a second direction perpendicular to the first direction. Certainly, the first connection elements 1021 can also be arranged on at least two different sides of the display region 01 in other ways.

It can be understood that, according to a size of each side of the non-display region 02, the first connection elements 1021 can be arranged in reasonable ways. For example, when one side of the non-display region 02 has a larger size along a certain direction, more first connection elements 1021 can be arranged along this direction to ensure connection stability between the array substrate 10 and the color filter substrate 20 in this direction.

In one embodiment, the first connection elements 1021 can be disposed at the same side of the display region 01. Here, reference can be made to FIG. 2, taking for example that the first connection elements 1021 can be disposed at the left side of the display region 01, and related embodiments can refer to the related description above. Certainly, the first connection elements 1021 can also be arranged at the same side of the display region 01 in other ways.

It can be understood that, when one side of the non-display region 02 has a size, in a certain direction, that is so small that the first connection element 1021 cannot be disposed, then at least one first connection element 1021 can be disposed on one side of the non-display region 02, that is sufficient large, to ensure that the array substrate 10 can be coupled to the color filter substrate 20.

Figure 3:
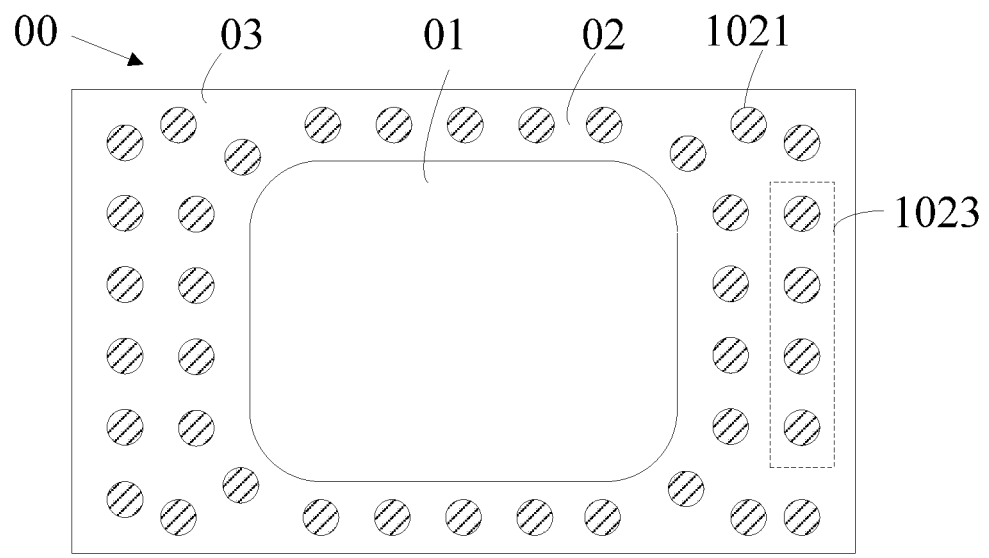
FIG. 3 is a schematic top view of the display panel according to a second embodiment of the present application.
Figure 4:
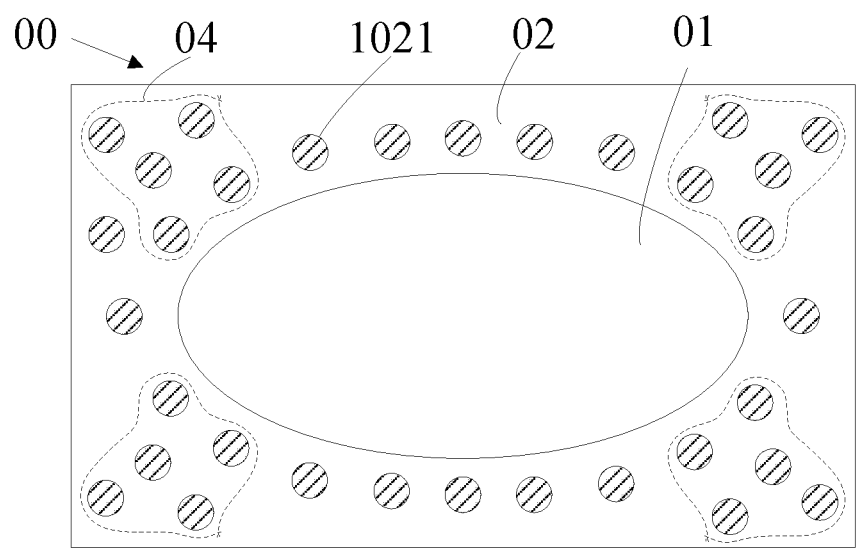
FIG. 4 is a schematic top view of the display panel according to a third embodiment of the present application.

In one embodiment, as shown in FIGS. 3 and 4, the first connection elements 1021 can be disposed around the display region 01.

Please refer to FIG. 3 which shows one embodiment. This embodiment takes for example that, the display region 01 is a rectangular-like shape with rounded corners, and the projection of the first connection element 1021 on the horizontal plane is circular, and multiple first connection elements 1021 can be located at an upper side, a lower side, a left side, and a right side, and the outside of the four rounded corners of the display region 01; however, the present application is not limited in this regard. Specifically, the first connection elements 1021 located at least one side of the display region 01 can be arranged along a third direction to form a second connection set 1023, wherein the third direction is parallel to a side of the display region 01 adjacent to the corresponding first connection elements 1021. Furthermore, the first connection elements 1021 located on at least one side of the display region 01 can also form multiple first connection sets 1022, wherein the first connection sets 1022 can be arranged along a fourth direction, and the fourth direction is perpendicular to the third direction. Furthermore, since an edge of the round corner of the display region 01 is far from an outer edge of the display panel 00, at least two first connection elements 1021 can be disposed in an area 03 near the round corner of the display region 01 to ensure that the array substrate 10 is coupled to the color filter substrate 20 more uniformly. Certainly, the first connection elements 1021 located at any side of the display region 01 can also be arranged in other ways.

Referring to one embodiment shown in FIG. 4, this embodiment takes for example that, the display region 01 has an elliptical shape, the projection of each first connection element 1021 on the horizontal plane is circular, and the first connection elements 1021 can be located in the whole outside of the display region 01; however, the present application is not limited in this regard. Specifically, the first connection elements 1021 located outside the display region 01 can be arranged parallel to tangent directions of some points on the edge of the display region 01. Similarly, in an outer area 04, at least two first connection elements 1021 can be disposed at an edge of the display region 01 and far from the outer edge of the display panel 00. Certainly, the first connection elements 1021 located outside certain points on the outer edge of the display region 01 can also be arranged in other ways.

When multiple first connection elements 1021 are disposed around the display region 01, it can be ensured that in an area around the display region 01, the array substrate 10 can be coupled to the color filter substrate 20 with improved connection reliability.

In one embodiment, when the projection of the first connection element 1021 on the horizontal plane is circular or polygonal, a width or diameter of the first connection element 1021 is not less than 2 microns (μm) and not greater than 15 microns. The width or diameter of the first connection element 1021 can be understood as a width or diameter of the projection of the first connection element 1021 on the horizontal plane, or can be understood as a width or diameter of a top surface or a bottom surface of the first connection element 1021.

In summary, when the projection of the first connection element 1021 on the horizontal plane is circular or polygonal, and the passivation layer 102 comprises multiple first connection elements 1021, the first connection elements 1021 are arranged in reasonable configurations according to the relative positional relationship between the display region 01 and the non-display region 02 and according to a size of the non-display region 02. Specifically, when the first connection elements 1021 have the same shape and size, the first connection elements 1021 can be evenly arranged in the non-display region 02, or when the connection elements 1021 have different shapes and sizes, the first connection elements 1021 with a larger size can be disposed at a larger area in the non-display region 02.

Figure 5:
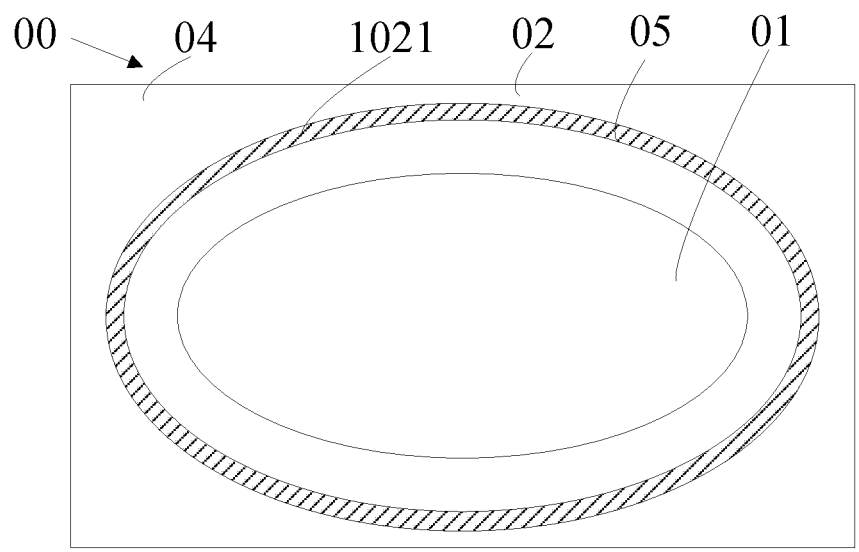
FIG. 5 is a schematic top view of the display panel according to a fourth embodiment of the present application.
Figure 6:
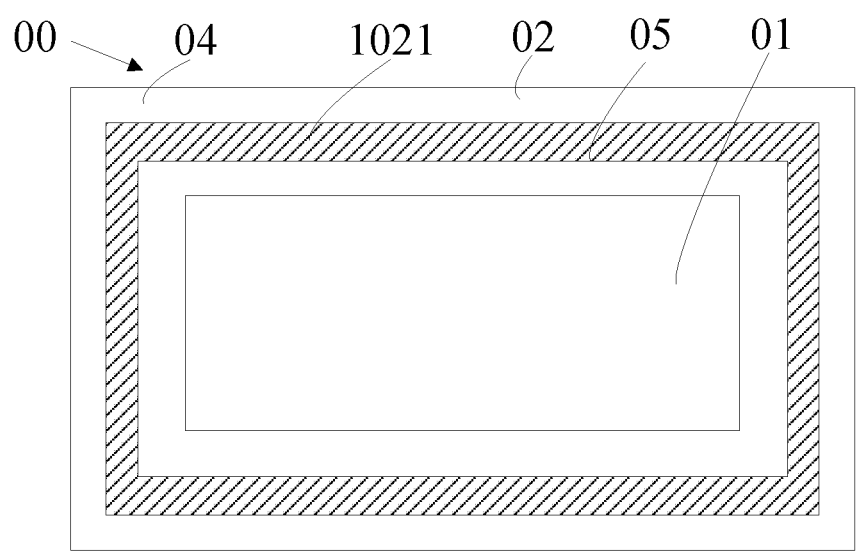
FIG. 6 is a schematic top view of the display panel according to a fifth embodiment of the present application.

According to one embodiment, as shown in FIGS. 5 and 6, the hollow shape of the first connection element 1021 projected on the horizontal plane has a hollow area 05, and a projection of the display region 01 on the horizontal plane is located in the hollow area 05. It can be understood that, the first connection element 1021 is continuously arranged around the display region 01. Compared with the above embodiment, the present embodiment can make the display region 01 completely surrounded, which increases a connection area between the array substrate 10 and the color filter substrate 20, ensures continuity of the connection area, and also improves connection reliability between the array substrate 10 and the color filter substrate 20.

At least one of an edge of the hollow shape on one side adjacent to the display region 01 and an edge of the hollow shape on one side away from the display region 01 comprises at least one of a straight line segment and a curved line segment. Specifically, the curved line segment can an arc segment or a serpentine line segment. At least one of the edge of the hollow shape on one side adjacent to the display region 01 and the edge of the hollow shape on one side away from the display region 01 matches in shape with the outer edge of the display region 01. Certainly, at least one of the edge of the hollow shape on one side adjacent to the display region 01 and the edge of the hollow shape on one side away from the display region 01 can also be a closed curve to increase a cross-sectional area of the first connection element 1021, thereby further increasing the connection area between the array substrate 10 and the color filter substrate 20, and improving the connection reliability therebetween.

In one embodiment, as shown in FIGS. 5 and 6, the edge of the hollow shape on one side away from the display region 01 matches in shape with an edge of the hollow area 05. For example, as shown in FIG. 5, the edge of the hollow shape on one side away from the display region 01 and the edge of the hollow area 05 can both have an elliptical shape, that is, the projection of the first connection element 1021 on the horizontal plane has a ring shape. In another example, as shown in FIG. 6, the edge of the hollow shape on one side away from the display region 01 and the edge of the hollow area 05 can both have a rectangular shape, that is, the projection of the first connection element 1021 on the horizontal plane has a frame shape.

Furthermore, the passivation layer 102 can comprise two first connection elements 1021, and one of the first connection elements 1021 can be arranged inside the hollow area 05 of the other first connection element 1021. Specifically, the shape and the number of the first connection elements 1021 may be set reasonably according to the shape and the size of the non-display region 02.

According to one embodiment, when the projection of the first connection element 1021 on the horizontal plane has a hollow shape, a distance between the edge of the hollow area 05 and the edge of the hollow shape on one side away from the display region 01 is not less than 2 microns, and not greater than 15 microns. For example, when the projection of the first connection element 1021 on the horizontal plane has a ring shape, it means that a width of the ring shape is not less than 2 microns and not greater than 15 microns.

In summary, when the projection of the first connection element 1021 on the horizontal plane has a hollow shape, and the hollow shape has the hollow area, the shape, size, and number of the first connection elements 1021 can be reasonably set according to the relative positional relationship between the display region 01 and the non-display region 02 and according to the size of the non-display region 02. For example, the shape of the first connection element 1021 can be consistent with the shape of the display region 01. When the non-display region 02 is larger, multiple first connection element 1021 can be disposed in the non-display region 02, and the first connection elements 1021 can have the same shape or different shapes.

According to one embodiment, along any longitudinal section of the passivation layer 102, a distance between two adjacent first connection elements 1021 located at the same side of the display region 01 is not less than 50 microns and not greater than 150 microns (μm). In other words, on the horizontal plane in the passivation layer 102 at the same side of the display region 01, the distance between any two adjacent first connection elements 1021 in any direction is not less than 50 microns and not greater than 150 microns. It can be understood that, when the projection of the first connection element 1021 on the horizontal plane has a hollow shape, a minimum distance between two adjacent first connection elements 1021 is not less than 50 microns and not greater than 150 microns. This can keep a certain distance between any two adjacent first connection elements 1021 and avoid any two adjacent first connection elements 1021 from communicating with each other to reduce evenness of distribution of the first connection elements 1021.

In one embodiment, a distance between any first connection element 1021 adjacent to the display region 01 and the display region 01 is not less than 215 microns and not greater than 225 microns. When the projection of the first connection element 1021 projected on the horizontal plane is circular or polygonal, it means that the distance between the first connection element 1021 closest to the display region 01 and the display region 01 is not less than 215 microns, and not greater than 225 microns; and when the projection of the first connection element 1021 projected on the horizontal plane has a hollow shape, it means that the distance between the first connection element 1021 with the smallest hollow area 05 and the display region 01 is not less than 215 microns, and not greater than 225 microns. This can make the first connection elements 1021 maintain a certain distance from the display region 01, and avoid the first connection element 1021 from affecting devices and films of the display region 01 to affect a display image.

Figure 7:
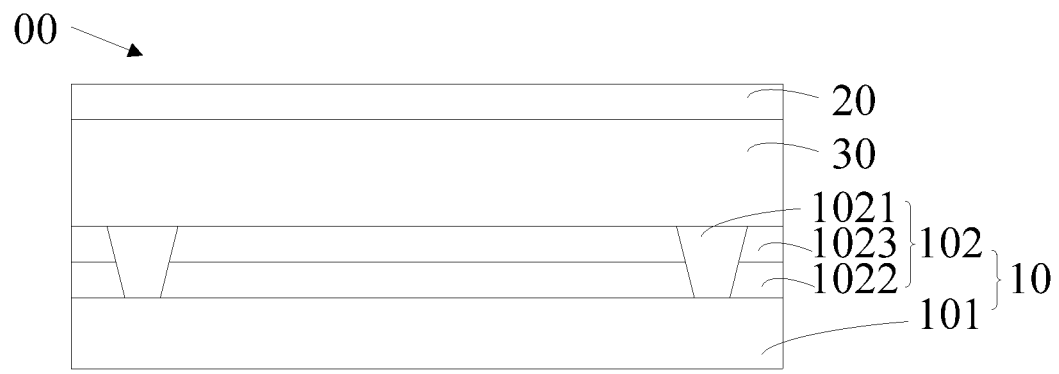
FIG. 7 is a schematic partial cross-sectional view of the display panel according to another embodiment of the present application.

According to one embodiment, as shown in FIG. 7, the passivation layer 102 comprises a first passivation layer 1022 and a second passivation layer 1023. The first passivation layer 1022 is disposed on the TFT layer 101. The second passivation layer 1023 is disposed on the first passivation layer 1022, a thickness of the second passivation layer 1023 is not less than $(0.95*10^{-7})$ mm, and not greater than $(1.05*10^{-7})$ mm, wherein the first connection element 1021 is disposed in the first passivation layer 1022 and the second passivation layer 1023.

Specifically, a thickness of the first passivation layer 1022 is 5 times the thickness of the second passivation layer 1023. Further, the first passivation layer 1022 and the second passivation layer 1023 can be made of the same material. For example, material of the first passivation layer 1022 and the second passivation layer 1023 can include silicon nitride.

Figure 8:
FIG. 8 is a schematic partial cross-sectional view of the display panel according to still another embodiment of the present application.

According to one embodiment, as shown in FIG. 8, the TFT layer 101 comprises an interlayer insulation layer 1011, a gate insulating layer 1012, the interlayer insulation layer 1011 comprises at least one second connection element 1013, and the second connection element 1013 is disposed corresponding to the first connection element 1021. The first connection element 1021 is connected to the second connection element 1013, and the colloid layer 30 couples the array substrate 10 and the color filter substrate 20 through the first connection element 1021 and the second connection element 1013.

According to one embodiment, the second connection element 1013, the first connection element 1021, and the colloid layer 30 can be made of the same material such as a material having adhesive properties on its upper and lower surfaces. Further, the second connection element 1013, the first connection element 1021, and the colloid layer 30 can be integrally formed. In detail, the passivation layer 102 includes at least one first through hole, the interlayer insulation layer 1011 includes a second through hole arranged corresponding to the first through hole, and the colloid layer 30 is filled into the first through hole and the second through hole to form the first connection element 1021 and the second connection element 1013.

For a detailed description about the second connection element 1013, please refer to the related description about the first connection element 1021 provided above.

The interlayer insulation layer 1011 can include a first interlayer insulation layer and a second interlayer insulation layer, the second interlayer insulation layer is arranged above the first interlayer insulation layer, and the second interlayer insulation layer can be arranged adjacent to the passivation layer 102, wherein the second connection element 1013 is disposed in the second interlayer insulation layer, or the second connection element 1013 is disposed in the first interlayer insulation layer and the second interlayer insulation layer. This way, a total length of the connection elements can be increased, and the connection reliability between the array substrate 10 and the color filter substrate 20 can be improved, wherein the connection elements comprise the first connection element 1021 and the second connection element 1013.

Specifically, the first interlayer insulation layer and the second interlayer insulation layer can be made of different materials. For example, material of the first interlayer insulation layer can include silicon nitride, and material of the second interlayer insulation layer can include silicon oxide.

The present application further provides a display device, and the display device comprises the display panel as described above.

The present application provides a display panel and a display device. The display panel comprises an array substrate, a color filter substrate, and a colloid layer. The array substrate sequentially comprises a thin film transistor layer and a passivation layer. The passivation layer comprises at least one first connection element. The color filter substrate is disposed opposite to the array substrate. The colloid layer is disposed between the passivation layer and the color filter substrate, the colloid layer is connected to the first connection element, and the colloid layer and the first connection element couple the array substrate to the color filter substrate. By having the first connection element in the passivation layer and using the colloid layer and the first connection element to couple the array substrate to the color filter substrate, reliable connection between the array substrate and the color filter substrate is ensured, and waterproofing and robustness of the display panel are improved.

The display panel and the display device of the present application are described in detail above. Specific examples are provided to explain the working principles and embodiments of the present invention. The descriptions of the above embodiments are only for ease of understanding of the technical solution and main ideas of the present invention. Those of ordinary skill in the art should be able to modify the technical solutions described in the foregoing embodi-

What is claimed is:

1. A display panel, wherein the display panel is constituted by a display region and a non-display region arranged around the display region, the display panel comprising:
 an array substrate, the array substrate comprising:
 a thin film transistor (TFT) layer; and
 a passivation layer disposed on the TFT layer, wherein the passivation layer comprises at least one first connection element, the first connection element is disposed in the non-display region, and a projection of each of the at least one first connection element projected on a horizontal plane is circular, polygonal, or of a hollow shape, wherein the projection of each of the at least one first connection element projected on the horizontal plane has a hollow shape, the hollow shape has a hollow area, and a projection of the display region projected on the horizontal plane is located inside the hollow area, wherein the passivation layer comprises two first connection elements, and one of the first connection elements is disposed inside the hollow area of the other first connection element;
 a color filter substrate disposed opposite to the array substrate; and
 a colloid layer, wherein the colloid layer is disposed between the passivation layer and the color filter substrate, the colloid layer is connected to the first connection element, and the colloid layer and the first connection element couple the array substrate to the color filter substrate.

2. The display panel according to claim 1, wherein the projection of each of the at least one first connection element projected on the horizontal plane is circular or polygonal, the passivation layer comprises multiple first connection elements, and the first connection elements are disposed at a same side or different sides of the display region.

3. A display panel, wherein the display panel is constituted by a display region and a non-display region arranged around the display region, the display panel comprising:
 an array substrate, the array substrate comprising:
 a thin film transistor (TFT) layer; and
 a passivation layer disposed on the TFT layer, the passivation layer comprising at least one first connection element, wherein the at least one first connection element is disposed in the non-display region, and a projection of each of the at least one first connection element projected on a horizontal plane is circular, polygonal, or of a hollow shape, wherein the passivation layer comprises multiple first connection elements, and the first connection elements are disposed at a same side or different sides of the display region;
 a color filter substrate, wherein the color filter substrate and the array substrate are arranged opposite to each other; and
 a colloid layer, wherein the colloid layer is disposed between the passivation layer and the color filter substrate, the colloid layer is connected to the first connection element, and the colloid layer and the first connection element couple the array substrate to the color filter substrate.

4. The display panel according to claim 3, wherein the first connection element is a solid of revolution or a polyhedron.

5. The display panel according to claim 3, wherein the first connection elements are disposed around the display region.

6. The display panel according to claim 3, wherein the projection of each of the at least one first connection element projected on the horizontal plane has the hollow shape, the hollow shape has a hollow area, and a projection of the display region projected on the horizontal plane is located inside the hollow area.

7. The display panel according to claim 6, wherein at least one of an edge of the hollow shape on one side adjacent to the display region and an edge of the hollow shape on one side away from the display region includes at least one of a straight line segment and a curved line segment.

8. The display panel according to claim 6, wherein an edge of the hollow shape on one side away from the display region matches in shape with an edge of the hollow area.

9. The display panel according to claim 6, wherein the passivation layer comprises two first connection elements, and one of the first connection elements is disposed inside the hollow area of the other first connection element.

10. The display panel according to claim 3, wherein the passivation layer comprises:
 a first passivation layer, the first passivation layer disposed on the TFT layer; and
 a second passivation layer disposed on the first passivation layer, wherein a thickness of the second passivation layer is greater than or equal to $(0.95*10^{-7})$ mm, and less than or equal to $(1.05*10^{-7})$ mm;
 wherein the first connection element is disposed in the first passivation layer and the second passivation layer.

11. The display panel according to claim 10, wherein a thickness of the first passivation layer is 5 times a thickness of the second passivation layer.

12. The display panel according to claim 3, wherein the TFT layer comprises an interlayer insulation layer, the interlayer insulation layer comprises at least one second connection element, and the at least one second connection element is disposed corresponding to the first connection element; and
 the first connection element is connected to the second connection element, and the colloid layer couple the array substrate to the color filter substrate through the at least one first connection element and the at least one second connection element.

13. The display panel according to claim 12, wherein the at least one second connection element is a solid of revolution or a polyhedron.

14. A display device, wherein the display device comprises the display panel of claim 3.

15. A display panel, comprising:
 an array substrate, the array substrate comprising:
 a thin film transistor (TFT) layer; and
 a passivation layer disposed on the TFT layer, the passivation layer comprising at least one first connection element;
 a color filter substrate, wherein the color filter substrate and the array substrate are arranged opposite to each other; and
 a colloid layer, wherein the colloid layer is disposed between the passivation layer and the color filter substrate, the colloid layer is connected to the first connection element, and the colloid layer and the first connection element couple the array substrate to the color filter substrate,
 wherein the passivation layer comprises:

a first passivation layer, the first passivation layer disposed on the TFT layer; and
a second passivation layer disposed on the first passivation layer, wherein a thickness of the second passivation layer is greater than or equal to $(0.95*10^{-7})$ mm, and less than or equal to $(1.05*10^{-7})$ mm;
wherein the first connection element is disposed in the first passivation layer and the second passivation layer.

16. The display panel according to claim 15, wherein a thickness of the first passivation layer is 5 times a thickness of the second passivation layer.

* * * * *